(12) United States Patent
Matsunami et al.

(10) Patent No.: US 9,200,974 B2
(45) Date of Patent: Dec. 1, 2015

(54) SEMICONDUCTOR PRESSURE SENSOR DEVICE AND METHOD OF MANUFACTURING THE SAME

(71) Applicant: FUJI ELECTRIC CO., LTD., Kawasaki-shi (JP)

(72) Inventors: Kazuhiro Matsunami, Matsumoto (JP); Katsuyuki Uematsu, Hata-machi (JP); Mutsuo Nishikawa, Matsumoto (JP); Shigeru Shinoda, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/313,704

(22) Filed: Jun. 24, 2014

(65) Prior Publication Data

US 2015/0001650 A1    Jan. 1, 2015

(30) Foreign Application Priority Data

Jun. 28, 2013    (JP) ................................ 2013-136304

(51) Int. Cl.
| | |
|---|---|
| *H01L 29/84* | (2006.01) |
| *H01L 29/66* | (2006.01) |
| *G01L 9/00* | (2006.01) |
| *F02D 41/14* | (2006.01) |

(52) U.S. Cl.
CPC ............. *G01L 9/0052* (2013.01); *G01L 9/0045* (2013.01); *G01L 9/0055* (2013.01); *F02D 41/1448* (2013.01)

(58) Field of Classification Search
CPC ..... H01L 29/84; G01L 9/0054; G01L 9/0042; G01L 9/0055; G01L 9/006; G01L 9/0061; G01P 15/123
See application file for complete search history.

(56) References Cited

U.S. PATENT DOCUMENTS

| | | |
|---|---|---|
| 2007/0210450 A1 | 9/2007 | Jang et al. |
| 2009/0218643 A1 | 9/2009 | Kaminaga et al. |

FOREIGN PATENT DOCUMENTS

| | | |
|---|---|---|
| JP | 10153508 A | 6/1998 |
| JP | 2007251158 A | 9/2007 |
| WO | 2007052335 A1 | 5/2007 |

*Primary Examiner* — Whitney T Moore
(74) *Attorney, Agent, or Firm* — Rossi, Kimms & McDowell LLP (57) ABSTRACT

Aspects of a semiconductor pressure sensor device can include a semiconductor substrate having a depressed portion which forms a vacuum reference chamber, a diaphragm disposed on the front surface of the semiconductor substrate, and strain gauge resistors. The device can further include an aluminum wiring layer disposed on the semiconductor substrate, an antireflection film which is a TiN film disposed on the aluminum wiring layer, an adhesion securing and diffusion preventing layer which is a film stack of a Cr film and Pt film disposed on the TiN film, and an Au film stacked on the adhesion securing and diffusion preventing layer.

16 Claims, 6 Drawing Sheets

SEMICONDUCTOR PRESSURE SENSOR DEVICE AND METHOD OF MANUFACTURING THE SAME

CROSS-REFERENCE TO RELATED APPLICATION

This application is based on, and claims priority to, Japanese Patent Application No. 2013-136304, filed on Jun. 28, 2013. The disclosure of the priority application, in its entirety, including the drawings, claims, and the specification thereof, is incorporated herein by reference.

BACKGROUND OF THE INVENTION

1. Field of the Invention

Embodiments the invention relate to semiconductor pressure sensor devices used in, for example, various kinds of apparatus for vehicular use, medical use, industrial use, or the like.

2. Description of the Related Art

Figure 7:
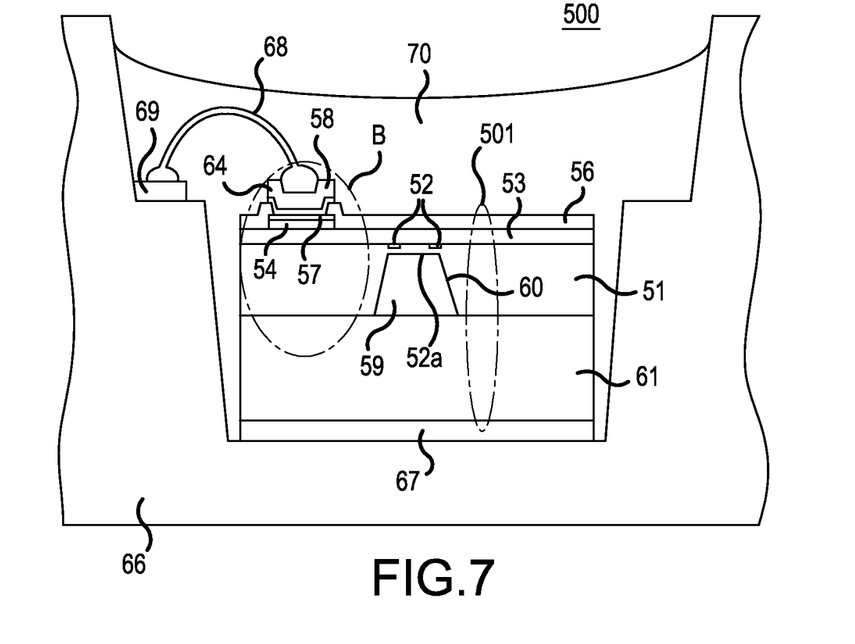
FIG. 7 is an overall configuration diagram of a semiconductor pressure sensor device 500.

FIG. 7 is an overall configuration diagram of a semiconductor pressure sensor device 500. The heretofore known semiconductor pressure sensor device 500 includes a semiconductor substrate 51 on the front surface side of which are formed a diaphragm 52a, strain gauge resistors 52, an unshown integrated circuit, and the like, a depressed portion 50 formed in the rear surface of the semiconductor substrate 51, a glass substrate 61 fixed to the rear surface of the semiconductor substrate 51, and a resin case 66 housing the semiconductor substrate 51 and glass substrate 61. A vacuum reference chamber 59 is formed by closing the depressed portion 60 in the semiconductor substrate 51 with the glass substrate 61, thus forming a semiconductor pressure sensor IC chip 501. A metal terminal 69 is provided on the resin case 66, and the semiconductor pressure sensor IC chip 501 is connected to the metal terminal 69 via a bonding wire 68 (an Al wire or Au wire). The glass substrate 61 is fixed to the resin case 66 by an adhesive 67, and the surface of the semiconductor pressure sensor IC chip 501 is coated with a protection material such as silicone gel 70.

An interlayer insulating film which is a silicon oxide film 53, an aluminium wiring layer 54, a TiW film 57 which is an adhesion securing and diffusion preventing layer, and an Au film 58 are disposed stacked on the semiconductor substrate 51. The function of the TiW film 57 which is the adhesion securing and diffusion preventing layer is to improve the adhesion to the aluminium wiring layer 54 and prevent Au atoms of the Au film 58 from diffusing to the aluminium wiring layer 54.

A pressure is applied to the diaphragm 52a, provided on the semiconductor pressure sensor IC chip 501, via a protection material such as the silicone gel 70. The strain gauge resistors 52, being provided on the diaphragm 52a, as previously described, is such that the larger the strain amount of the diaphragm 52a, the more greatly the resistance value of the strain gauge resistors 52 changes. A bridge circuit is configured of the strain gauge resistors 52, and converts a change in resistance to a change in voltage, and the change in voltage is voltage output to the exterior via an analog circuit (an integrated circuit) such as an amplifier circuit.

This kind of semiconductor pressure sensor device 500 is used as an intake pressure sensor which measures the pressure of an intake system of an internal combustion engine of a vehicle or the like, but in recently years, has also been used in detecting the pressure of an exhaust system under tightening environmental regulations and safety regulations. As the semiconductor pressure sensor device 500, when used in measuring the pressure of the intake system, only exposed to comparatively clean air or atomized gasoline, chemical resistance required of the semiconductor pressure sensor device 500 is mainly only the resistance to fuel such as gasoline. Therefore, the electrode and bonding wire of the integrated circuit is configured from aluminium or an alloy made mainly from aluminium, and the surface of the integrated circuit is protected by the silicone gel 70 or the like with high chemical resistance, thereby enabling sufficient securing of the resistance of the integrated circuit surface.

However, as the semiconductor pressure sensor device 500, when used in measuring the pressure f the exhaust system, is also exposed to a corrosive substance generated from a nitrogen compound, sulfide, or the like, exhausted from the internal combustion engine, the resistance to various corrosive substances is required of the semiconductor pressure sensor device 500, and as a measure to respond to the requirement, there is proposed a technology wherein a Ti film and Pd film for preventing corrosion are provided on the surface of an aluminium electrode (see, for example, Japanese Patent Application Publication No. JP-A-10-163608).

Also, with the structure of Japanese Patent Application Publication No. JP-A-10-153508, the resistance to corrosion due to nitrate ions formed from nitrogen oxide contained in an exhaust gas is insufficient, in response to which there is proposed a technology wherein a TiW film is provided on the aluminium electrode as an adhesion securing and diffusion preventing layer, and the front surface of the TiW film is coated with an Au film having high corrosion resistance (see, for example, WO 2007-052335).

Also, Japanese Patent Application Publication No. 2007-251158 describes a configuration (a stepped structure) wherein, in order to prevent a diffusion prevention film from being undercut, the diffusion prevention film projects laterally from a seal film.

The TiW film and Au film coating the front surface of the aluminium wiring layer are formed by sputtering or vapor deposition which is a metal film formation method commonly used in a semiconductor, and wet etching, liftoff, or the like, is used in etching for patterning the formed metal film.

Figure 8:
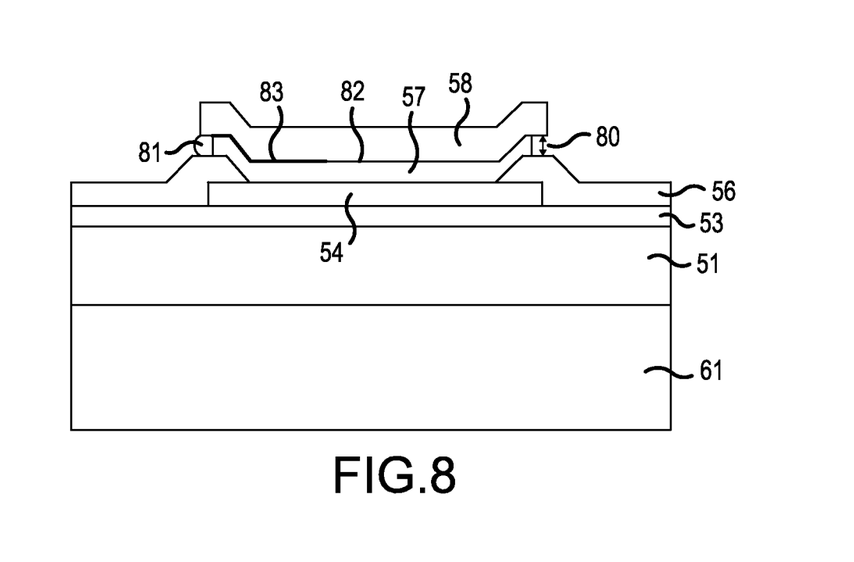
FIG. 8 is a manufacturing process sectional view corresponding to the B portion of FIG. 7.

As previously described, a plurality of films, such as the adhesion securing and diffusion preventing layer, formed of the TiW film 57, and the Au film 58 having high corrosion resistance, are formed on the aluminium wiring layer 54 by sputtering or vapor deposition. When wet etching is used in etching the formed films, the formed films are wet etched in order from the top layer using an etching solution appropriate for each layer (the Au film 58 and TiW film 57). Because of this, the side etching of the TiW film 57 which is the adhesion securing and diffusion preventing layer close to the aluminium wiring layer 54 increases. The side etching causes an edge portion of the TiW film 57 between the most front Au film 58 with high corrosion resistance and a passivation film 56 to withdraw inward, thus forming a minute gap 80 which is a recess (FIG. 8). FIG. 8 is a manufacturing process sectional view corresponding to the B portion of FIG. 7.

When a gas reaches this kind of minute gap 80, it is easy for the gas to turn to a liquid 81 by capillary condensation.

Meanwhile, the corrosion of a metal such as the TiW film 57 also progresses due to a nitrogen compound or sulfide in a gaseous state, but it is often the case that the corrosion progression is accelerated by the mediation of moisture. Therefore, in some cases, a nitrogen compound or sulfide, moisture, and the like, in a gaseous state, which have intruded into the minute gap 80, turn to the liquid 81 in the minute gap 80, thereby resulting in the progression of corrosion. The corrosion, combined with galvanic corrosion (corrosion between dissimilar metals), called a voltaic cell, between two metal layers (for example, the TiW film 57 and Au film 58), occurs in an interface 82 between the TiW film 57 and Au film 58. When the corrosion progresses, the adhesion of the Au film 58 (a pad electrode) and TiW film 57 decreases, and exfoliation 83 occurs in the interface 82.

As the adhesion securing and diffusion preventing layer formed of the TiW film 57 is low in corrosion resistance, as previously described, it is difficult to use the adhesion securing and diffusion preventing layer in a harsh environment such as in the exhaust system.

Also, as a liftoff method is such to mechanically separate a metal film when removing a resist, thus forming a pattern, the liftoff method is not suitable for a fine pattern formation to several ten μm.

Also, Japanese Patent Application Publication No. 2007-251158 is not such as to deal with the problem of corrosion when using the structure as a pressure sensor in the exhaust system. Furthermore, it is not described in Japanese Patent Application Publication No. 2007-251158 that the side wail of the TiW film 57 and Au film 58 is formed into a normal tapered shape to be described hereafter, thus preventing the formation of the minute gap 80 and suppressing corrosion.

SUMMARY OF THE INVENTION

Embodiments of the invention, having been contrived bearing in mind the heretofore described problems, provide a semiconductor pressure sensor device, and a method of manufacturing the device, wherein it is possible to suppress corrosion even in a harsh environment such as in an exhaust system, According to a first aspect of the invention, a semiconductor pressure sensor device disposed in an exhaust system of an internal combustion engine, includes a diaphragm, disposed on a semiconductor substrate, which is strained in accordance with a pressure; strain gauges connected to and disposed on the diaphragm; a metal wiring layer connected to the strain gauges and disposed on the semiconductor substrate via an interlayer insulating film; a passivation film having an opening portion from which the metal wiring layer is exposed; an adhesion securing and diffusion preventing layer, disposed on the passivation which coats the exposed top, and the edge portion, of the metal wiring layer; and a conductive layer configuring a pad electrode stacked on the adhesion securing and diffusion preventing layer. The edge face of a stacked metal layer configured of the adhesion securing and diffusion preventing layer and conductive layer is of a normal tapered shape or stepped shape which expands toward the semiconductor substrate side.

Also, according to a second aspect of the invention, in the first aspect of the invention, it is preferable that a glass substrate is fixed to the rear surface of the semiconductor substrate by electrostatic bonding.

Also, according to a third aspect of the invention, in the first aspect of the invention, it is preferable that the metal wiring layer is an aluminium wiring layer, the adhesion securing and diffusion preventing layer is a film wherein a Cr film and Pt film, or a Ti film and the Pt film, are tacked upward from the semiconductor substrate side, and the conductive layer is an Au film stacked on the Pt film.

Also, according to a fourth aspect of the invention, in the first aspect of the invention, it is preferable that the adhesion securing and diffusion preventing layer is a single layer film of either the Cr film or Ti film, and the conductive layer is a Pt film or Au film.

Also, according to a fifth aspect of the invention, in the first aspect of the invention, it is preferable that an antireflection film is interposed between the metal wiring layer and the adhesion securing and diffusion preventing layer.

Also, according to a sixth aspect of the invention, in the fifth aspect of the invention, it is preferable that the antireflection film is a TiN film, Also, according to a seventh aspect of the invention, a method of manufacturing the semiconductor pressure sensor device according to the fifth aspect of the invention includes a step of forming the antireflection film on the metal wiring layer; a step of forming the passivation film having the opening portion; a step of fixing the glass substrate to the rear surface of the semiconductor substrate by electrostatic bonding; and a stacked metal layer formation step which forms the adhesion securing and diffusion preventing layer and conductive layer on the antireflection film and passivation film. The stacked metal layer formation step includes a step of forming the adhesion securing and diffusion preventing layer and conductive layer on the whole front surface side of the semiconductor substrate by sputtering; a step of selectively forming a resist mask on the formed conductive layer; and a step of etching the conductive layer and adhesion securing and diffusion preventing layer by ion milling.

Also, according to an eighth aspect of the invention, in the method of manufacturing the semiconductor pressure sensor device according to the first aspect of the invention, it is preferable that the normal tapered shape of the edge face of the stacked metal layer is formed by on milling which etches the stacked metal layer by causing Ar ions to collide against the stacked metal layer via the mask.

Also, according to a ninth aspect of the invention, in the eighth aspect of the invention, it is preferable that the front surface of the stacked metal layer is inclined downward so as to form an acute angle with reference to a direction perpendicular to the range axis of the Ar ions.

Also, according to a tenth aspect of the invention, in the ninth aspect of the invention, it is preferable that an angle θ at which, with the range axis of the Ar ions being horizontalized, the front surface of the stacked metal layer is inclined downward with reference to a direction perpendicular to the horizontalized range axis is $0° \leq \theta \leq 50°$.

Also, according to an eleventh aspect of the invention, in the tenth aspect of the invention, it is preferable that the angle θ is $0° \leq \theta \leq 50°$.

Also, according to a twelfth aspect of the invention, in the eighth aspect of the invention, it is preferable that the glass substrate is fixed to the rear surface of the semiconductor substrate by electrostatic bonding.

According to embodiments of the invention, it is possible to produce a semiconductor pressure sensor device, and a method of manufacturing the device, wherein it is possible to suppress corrosion even in a harsh environment such as in an exhaust system.

BRIEF DESCRIPTION OF THE DRAWINGS

FIGS. 1A and 1B are configuration diagrams of a semiconductor pressure sensor device 100 of a first working example according to the invention, wherein

FIGS. 5A and 5B, following FIGS. 4A to 4C, are main portion manufacturing process sectional views of the semiconductor pressure sensor device 100 of the third working example according to the invention;

DETAILED DESCRIPTION

Embodiments of the invention will be described with the following working examples.

First Working Example

Figure 1A:
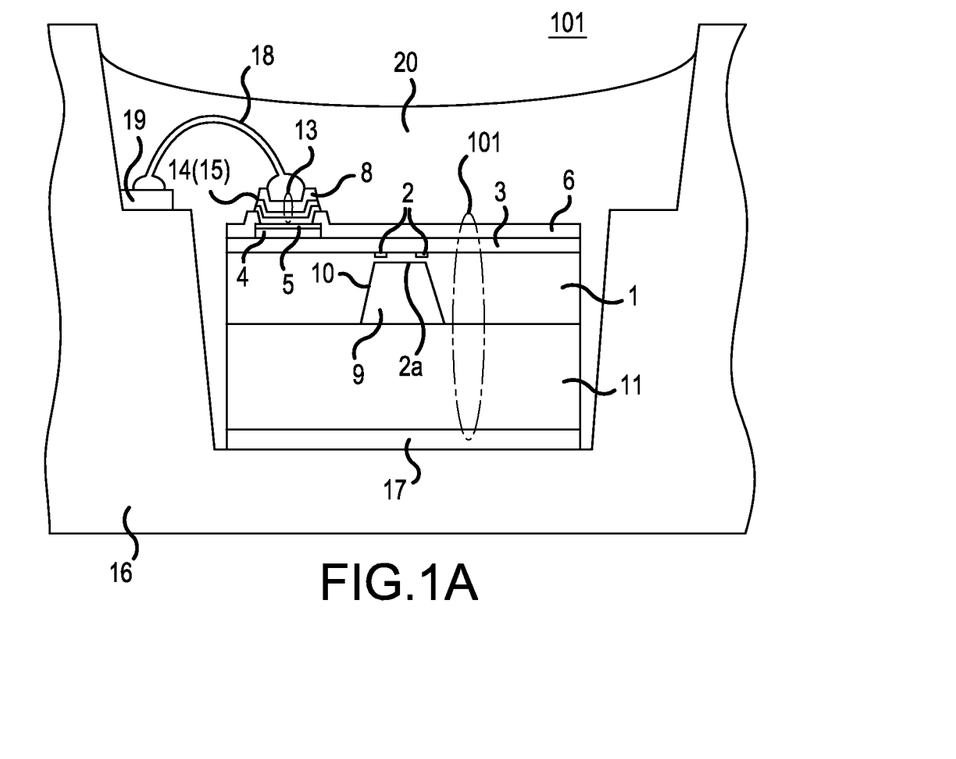
FIG. 1A is an overall configuration diagram.
Figure 1B:
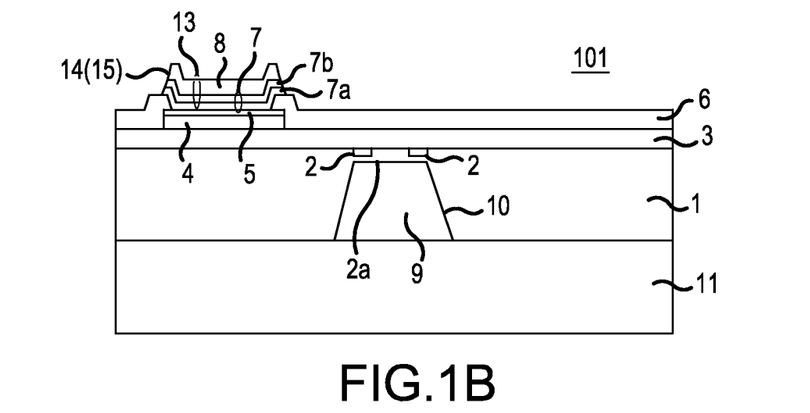
FIG. 1B is a main portion sectional view of a semiconductor pressure sensor IC chip 101.

FIGS. 1A and 1B are configuration diagrams of a semiconductor pressure sensor device 100 of a first working example according to the invention, wherein FIG. 1A is an overall configuration diagram, and FIG. 1B is a main portion sectional view of a semiconductor pressure sensor IC chip 101.

In FIG. 1A, the semiconductor pressure sensor device 100 includes a semiconductor substrate 1 on the front surface side of which are formed a diaphragm 2*a*, strain gauge resistors 2, an unshown integrated circuit, and the like, a depressed portion 10 formed in the rear surface of the semiconductor substrate 1, a glass substrate 11 fixed to the rear surface of the semiconductor substrate 1, and a resin case 16 housing the semiconductor substrate 1 and glass substrate 11. A vacuum reference chamber 9 is formed by closing the depressed portion 10 in the semiconductor substrate 1 with the glass substrate 11, thus forming the semiconductor pressure sensor IC chip 101. A metal terminal 19 is provided on the resin case 16, and the semiconductor pressure sensor IC chip 101 is connected to the metal terminal 19 via a bonding wire 18 (an Al wire or Au wire). The glass substrate 11 is fixed to the resin case 16 by an adhesive 17, and the surface of the semiconductor pressure sensor IC chip 101 is coated with a protection material such as silicone gel 20.

In FIG. 1B, the semiconductor pressure sensor IC chip 101 configuring the semiconductor pressure sensor device 100 includes the semiconductor substrate 1 having the depressed portion 10 which forms the vacuum reference chamber 9, the diaphragm 2*a* disposed on the front surface of the semiconductor substrate 1, and the strain gauge resistors 2 electrically connected to the diaphragm 2*a*. The semiconductor pressure sensor IC chip 101 includes an interlayer insulating film, which is a silicon oxide film 3 electrically connected to the strain gauge resistors 2 and disposed on the semiconductor substrate 1, and an aluminium wiring layer 4, which is an Al—Si—Cu film disposed on the silicon oxide film 3. The semiconductor pressure sensor IC chip 101 includes an anti-reflection film, which is a TiN film 5 disposed on the aluminium wiring layer 4, and a passivation film 6, having an opening portion, which is formed of a silicon oxide film 6*a* and silicon nitride film 6*b* disposed on the TiN film 5. The semiconductor pressure sensor IC chip 101 includes an adhesion securing and diffusion preventing layer 7, which is a film stack of a Cr film 7*a* and Pt film 7*b* (refer to FIGS. 4A to 4C) disposed on the TIN film 5 exposed from the opening portion, and an Au film 8 (which forms an Au electrode) stacked on the adhesion securing and diffusion preventing layer 7. Also, the semiconductor pressure sensor IC chip 101 includes the glass substrate 11 electrostatically bonded to the semiconductor substrate 1 on the opening side of the depressed portion 10 (that is, to the rear surface of the semiconductor substrate 1). The glass substrate 11 is fixed to the semiconductor substrate 1, thereby forming the vacuum reference chamber 9.

The original function of the TiN film 5 which is the anti-reflection film is to prevent halation occurring at the time of exposure in photolithography. Apart from this function in the invention, the TiN film 5 functions to suppress a large hillock being formed on the aluminium wiring layer 4 at a temperature (of on the order of 400° C.) when electrostatically bonding the glass substrate 11 to the semiconductor substrate 1. Because of this, it is possible to reduce the thickness of the Au film 8.

Also, the film stack of the Cr film 7*a* and Pt film 7*b* used as the adhesion securing and diffusion preventing layer 7 functions to prevent corrosion even in a harsh environment such as in an exhaust system.

The Cr film 7*a*, Pt film 7*b*, and Au film 8 are stacked upward from the semiconductor substrate 1 side, thus forming a stacked metal layer 13, and an edge face 14 of the stacked metal layer 13 is processed into a tapered shape (herein called a normal tapered shape 15) expanding toward the semiconductor substrate 1 side. The processing into the normal tapered shape 15 prevents a recess from being fanned at the edge face of the adhesion securing and diffusion preventing layer 7 formed of the Cr film 7*a* and Pt film 7*b*. Owning to no recess being formed, it is difficult for a corrosive gas which has reached the Au film 8 (a pad electrode) to change from a gaseous state to a liquid state, and it is possible to suppress corrosion in this portion due to an exhaust gas. As a result of this, it is possible to prevent the interface between the Cr film 7*a* and Pt film 7*b* which form the adhesion securing and diffusion preventing layer 7 from exfoliating due to the corrosion. The Cr film 7*a* of the adhesion securing and diffusion preventing layer 7 functions to adhere to the underlying TiN film 5 (to the aluminium wiring layer 4 when the TIN film 5 does not exist) and to prevent the diffusion between the underlying aluminium wiring layer 4 and upper Au film 8. The Pt film 7*b* functions to prevent the diffusion between the underlying aluminium wiring layer 4 and upper Au film 8.

In the previous description, the stacked metal layer 13 is configured of three layers; the Cr film 7*a*, Pt film 7*b*, and Au film 8, but in some cases, is configured of two layers; the Cr film 7*a* and Au film 8, the Pt film 7*b* and Au film 8, the Cr film 7*a* and Pt film 7*b*, a Ti film and the Pt film 7*b*, or the like, which two films are stacked upward from the semiconductor substrate 1 side. That is, as the stacked metal layer 13, apart from the three-layer structure of the Cr film 7*a*, Pt film 7*b*, and Au film 8, there are the three-layer structure of the Ti film, Pt film, and Au film, the two-layer structure of the Cr film and Au film, the Ti film and Au film, the Cr film and Pt film, or the Ti film and Pt film, and the like. The corrosion is prevented, and the exfoliation is thus prevented, by forming the edge face 14 of each of these stacked metal layers 13 into the normal tapered shape 15. Galvanic corrosion due to the battery effect caused between the metal films is also involved in the corrosion.

Also, the aluminium wiring layer 4 is an Al—Si film (an Al film in which on the order of 1% of Si is mixed) or an Al—Si—Cu film (an Al film in which on the order of 1% of Si and on the order of 0.5% of Cu are mixed).

The adhesion securing and diffusion preventing layer 7 may be a single layer film of either the Cr film or Ti film. Also, the Pt film may be used in place of the Au film 8. The stacked metal layer 13 may be configured of a combination of the previously described layer structures.

First Modification Example

Figure 2:
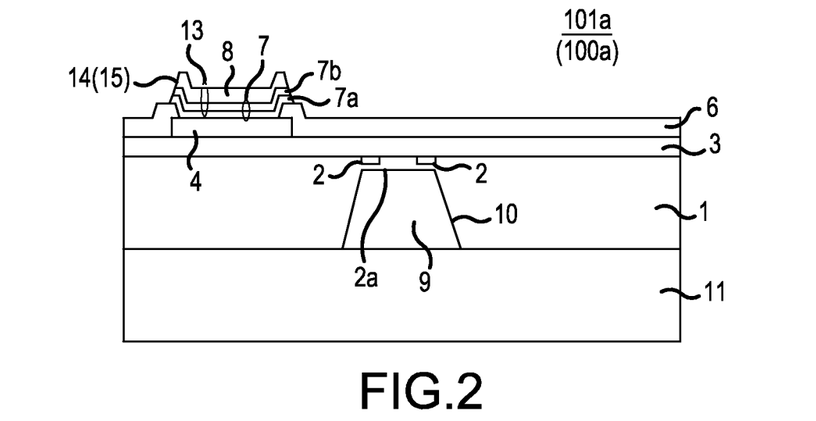
FIG. 2 is a main portion sectional view of a semiconductor pressure sensor device 100a showing a modification example of the semiconductor pressure sensor device 100 shown in FIGS. 1A and 1B.

FIG. 2 is a main portion sectional view of a semiconductor pressure sensor device 100a showing a modification example of the semiconductor pressure sensor device 100 shown in FIGS. 1A and 1B. FIG. 2 is a main portion sectional view of a semiconductor pressure sensor IC chip 101a.

The difference from FIG. 1 is that the antireflection film formed of the TIN film 5 inserted between the aluminium wiring layer 4 and the adhesion securing and diffusion preventing layer 7 is omitted. In this case too, as the formation of the recess is suppressed by forming the side surface of the stacked metal layer 13 into the normal tapered shape 15, it is possible to obtain the same advantageous effects as in FIGS. 1A and 1B. However, as the TiN film 5 which is the antireflection film does not exist, it is not possible to suppress a large hillock being formed from the aluminium wiring layer 4, meaning that it is necessary to increase the thickness of the adhesion securing and diffusion preventing layer 7 and Au film 8.

Second Working Example

Figure 3:
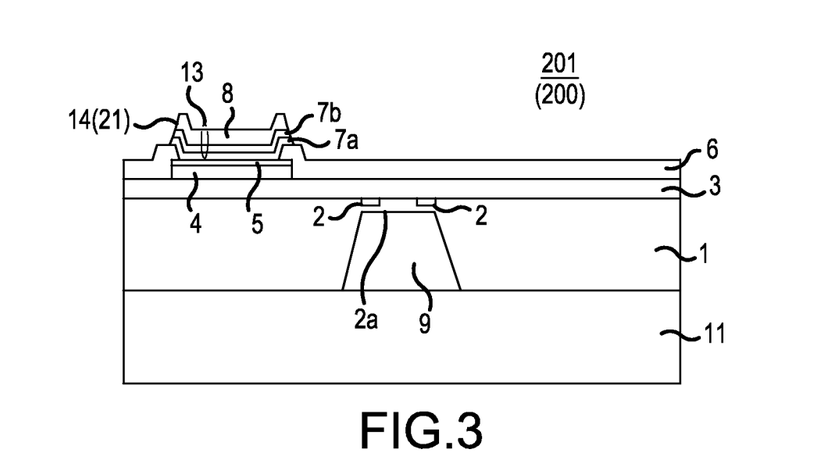
FIG. 3 is a main portion sectional view of a semiconductor pressure sensor device 200 of a second working example according to the invention.

FIG. 3 is a main portion sectional view of a semiconductor pressure sensor device 200 of a second working example according to the invention. FIG. 3 is a main portion sectional view of a semiconductor pressure sensor IC chip 201.

The difference from FIG. 1 is that the edge face 14 of the Cr film 7a, Pt film 7b, and Au film 8 configuring the stacked metal layer 13 forms a stepped shape 21 expanding toward the semiconductor substrate side. In this case too, the formation of the recess is suppressed.

Third Working Example

FIGS. 4A to 4C, 5D, and 5E are main portion manufacturing process sectional views showing in the process order and a method of manufacturing a semiconductor pressure sensor device 100 of a third working example according to the invention.

Figure 4A:
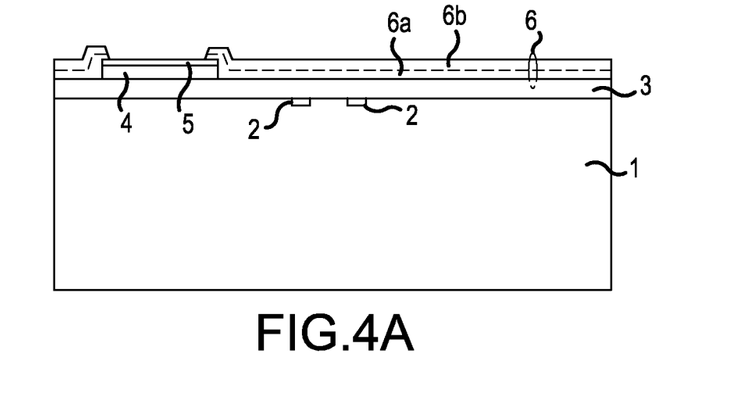
FIGS. 4A to 4C are main portion manufacturing process sectional views of a semiconductor pressure sensor device 100 of a third working example according to the invention.

1. In FIG. 4A, the strain gauge resistors 2 are formed on the front surface side of the semiconductor substrate 1, and the silicon oxide film 3 which is the interlayer insulating film is formed on the strain gauge resistors 2. Subsequently, the aluminium wiring layer 4 is formed on the silicon oxide film 3. Subsequently, the TiN film 5 which is the antireflection film is formed on the aluminium wiring layer 4. The passivation film 6 formed of the silicon oxide film 6a and silicon nitride film 6b is formed so as to coat the periphery of the edge portions of the TiN film 5 and aluminium wiring layer 4.

Figure 4B:
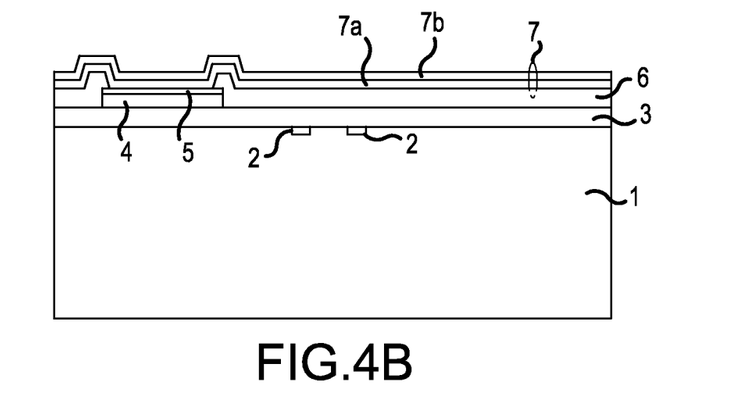

2. In FIG. 4B, the adhesion securing and diffusion preventing layer 7 formed of the Cr film 7a and Pt film 7b is formed on the TiN film 5 by sputtering.

Figure 4C:
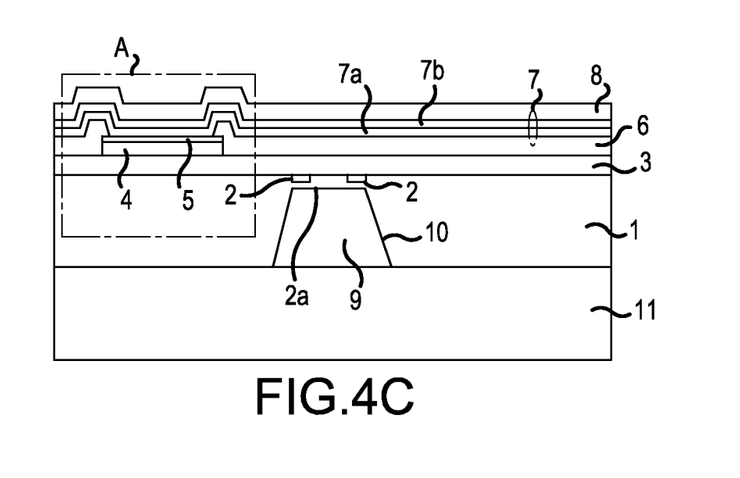

3. In FIG. 4C, the Au film 8 is formed on the adhesion securing and diffusion preventing layer 7 by sputtering. After the semiconductor substrate 1 is reduced in thickness by grinding the rear surface thereof, the depressed portion 10 is formed. Subsequently, the glass substrate 11 is affixed to the rear surface. The depressed portion 10 is dosed with the glass substrate 11 by the affixment, thus forming the vacuum reference chamber 9. Also, the affixment is carried out by electrostatic bonding (anodic bonding) at a high temperature of on the order of 400° C., but as the aluminium wiring layer 4 is coated with the TiN film 5 which is the antireflection film, formation of a large hillock from the aluminium wiring layer 4 is suppressed. Because of this, it is possible to reduce the thickness of the adhesion securing and diffusion preventing layer 7 and Au film 8.

Figure 5A:
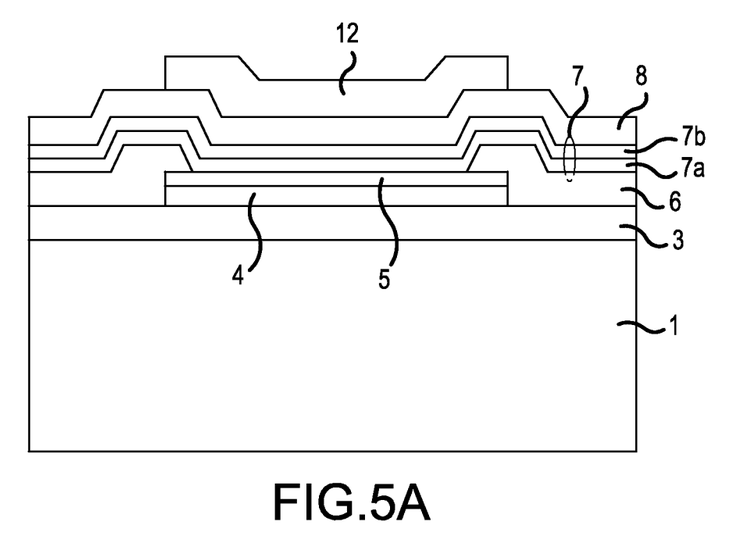

4. In FIG. 5A, the Au film 8 immediately above the aluminium wiring layer 4 is coated with a resist mask 12. FIG. 5A is an enlarged view of the A portion of FIG. 4C.

Figure 5B:
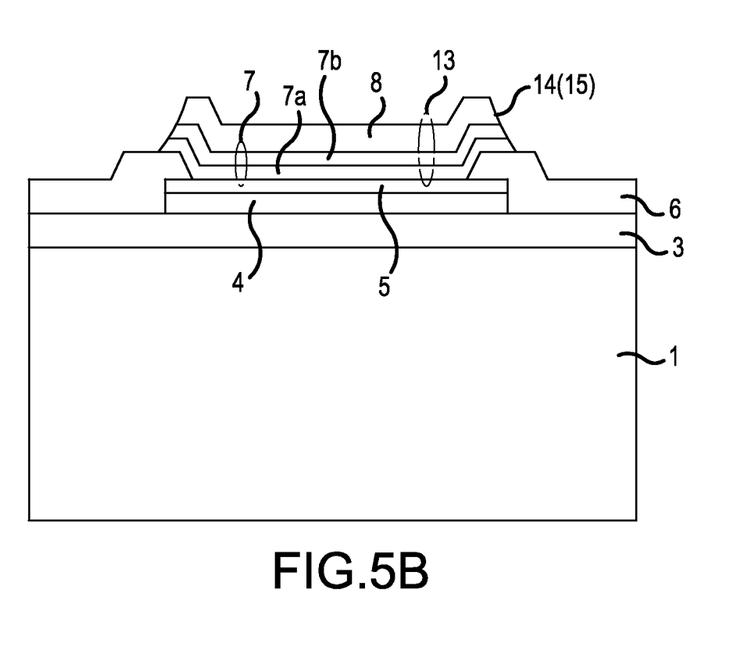

5. in FIG. 5B, the stacked metal layer 13 of the Cr film 7a, Pt film 7b, and Au film 8 is dry etched by ion milling, and the edge face 14 of the stacked metal layer 13 is processed into the normal tapered shape 15. The ion milling, as the etching rate thereof is higher than that of a normal dry etching, contributes to a reduction in processing time. The formation of the recess (which corresponds to a minute gap 80 in FIG. 8) is prevented by forming the edge face 14 of the stacked metal layer 13 into the normal tapered shape 15. The portion of the stacked metal layer 13 formed into the normal tapered shape 15 by the ion milling forms the pad electrode.

Subsequently, the semiconductor substrate 1 and glass substrate 11 bonded thereto are diced together, thereby forming the semiconductor pressure sensor IC chip 101. The semiconductor pressure sensor IC chip 101 is fixed to the resin case 16 by the adhesive 17 and housed in the resin case 16, and the Au film 8 configuring the pad electrode and the metal terminal 19 of the resin case 16 are connected by the bonding wire 18 made of gold. Subsequently, the resin case 16 is filled with the silicone gel 20, thus forming the semiconductor pressure sensor device 100 shown in FIG. 1A.

Figure 6:
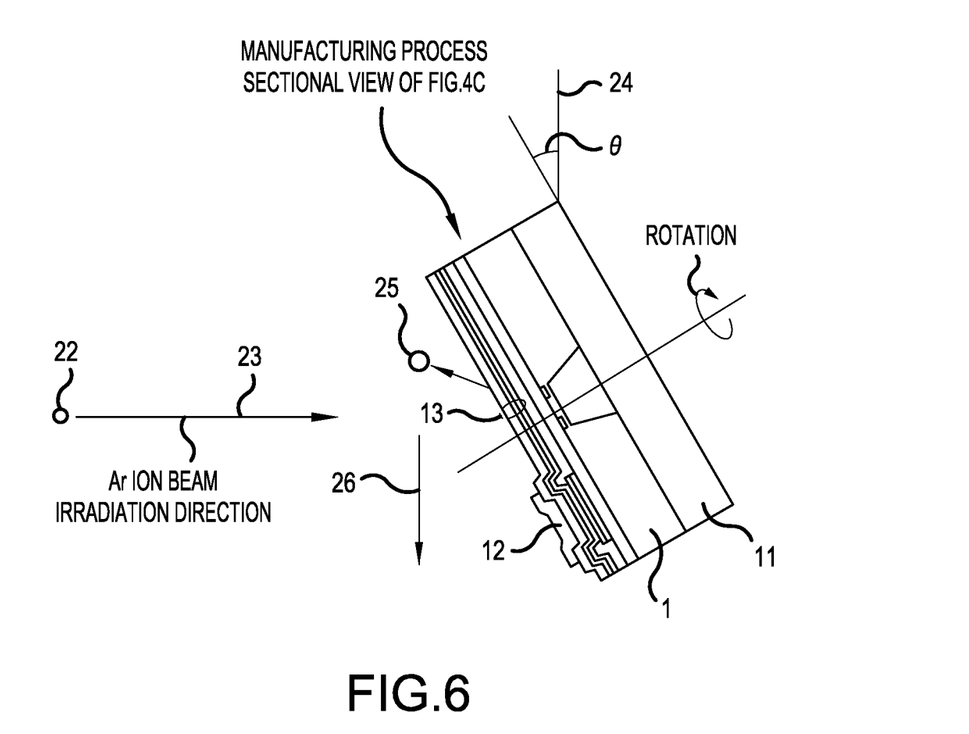
FIG. 6 is a diagram illustrating an ion miffing process.

FIG. 6 is a diagram illustrating the on milling process of FIG. 4C. The semiconductor substrate 1 with the glass substrate 11 affixed thereto is inclined, and the front surface of the stacked metal layer 13 is ion milled by being collided by an Ar ion 22 advancing in a straight line (irradiated with an Ar ion beam), thus processing the edge face 14 of the stacked metal layer 13 into the normal tapered shaped 15. The semiconductor substrate 1 with the glass substrate 11 affixed thereto is inclined at an angle θ at which the front surface of the semiconductor substrate 1 (the rear surface of the glass substrate 11) forms an acute angle with reference to a direction 24 perpendicular to a range axis 23 of the horizontally traveling Ar ion 22 (to an Ar ion beam axis). By inclining the front surface of the semiconductor substrate 1 in this way, and causing the semiconductor substrate 1 to rotate, a scattering matter 25 which has flown out from the stacked metal layer 13 due to the ion milling is prevented from falling in a gravity direction 26 and being attached again to the front surface of the semiconductor substrate 1. By the attachment being prevented, it is possible to prevent the residue of the stacked metal layer 13. Also, it is also possible to prevent an Ar ion source from being contaminated with the scattering matter 25. It is good that the inclination angle θ is 0°≤θ≤50°.

When the angle θ is less than 0° (when the angle θ is minus, and the front surface of the semiconductor substrate faces upward), it is easy for the reattachment to occur. Also, when the angle θ exceeds 50°, the thickness of the mask makes a shadow, and the collision density of Ar ions in the etched portion decreases, leading to a reduction in the etching speed of the ion milling. Because of this, it is preferable that the angle θ is 0°≤θ≤50°.

Even when the semiconductor substrate 1 is placed horizontally, and Ar ions are caused to collide against the front surface of the stacked metal layer 13 in the vertical direction, it is possible to form the edge face 14 of the stacked metal layer 13 into the normal tapered shape 15 However, when the front surface of the semiconductor substrate 1 faces upward, it is easy for the scattering matter 25 to be attached to the front surface of the semiconductor substrate 1, meaning that there is a need for measures to prevent the attachment. Meanwhile, when the front surface of the semiconductor substrate 1 faces directly downward, then, there is a need for measures to prevent the scattering matter 25 from falling and being attached to the Ar ion source disposed immediately below the semiconductor substrate 1. Because of this, it is good to adopt the previously mentioned angle ($0° \leq \theta \leq 50°$) because the need for these measures is eliminated by so doing.

Also, the configuration of the invention is effective when a semiconductor physical quantity sensor device such as a semiconductor acceleration sensor device is used in a harsh environment such as in an exhaust system, apart from the semiconductor pressure sensor devices 100, 200, and 300 used in a harsh environment such as in an exhaust system.

The invention can also be applied to a sensor, having provided in the glass substrate 11 thereof a through hole communicating with the diaphragm 2a, which measures a difference in pressure between the front surface side and rear surface side of the diaphragm 2a. Also, the invention can also be applied to a semiconductor pressure sensor devices wherein a vacuum reference chamber is formed by providing a cavity in the semiconductor substrate 1 without using the glass substrate 11.

What is claimed is:

1. A semiconductor pressure sensor device disposed in an exhaust system of an internal combustion engine, comprising:
   a diaphragm, disposed on a semiconductor substrate, which is strained in accordance with a pressure;
   strain gauges connected to and disposed on the diaphragm;
   a metal wiring layer connected to the strain gauges and disposed on the semiconductor substrate via an interlayer insulating film;
   a passivation film having an opening portion from which the metal wiring layer is exposed;
   an adhesion securing and diffusion preventing layer, disposed on the passivation film, which coats the exposed top, and the edge portion, of the metal wiring layer; and
   a conductive layer configuring a pad electrode stacked on the adhesion securing and diffusion preventing layer, wherein
   the edge face of a stacked metal layer configured of the adhesion securing and diffusion preventing layer and conductive layer is of a normal tapered shape or stepped shape which expands toward the semiconductor substrate side.

2. The semiconductor pressure sensor device according to claim 1, wherein a glass substrate is fixed to the rear surface of the semiconductor substrate.

3. The semiconductor pressure sensor device according to claim 1, wherein the metal wiring layer is an aluminium ring layer, the adhesion securing and diffusion preventing layer is a film stack wherein a Cr film and Pt film, or a Ti film and the Pt film, are stacked upward from the semiconductor substrate side, and the conductive layer is an Au film stacked on the Pt film.

4. The semiconductor pressure sensor device according to claim 1, wherein the adhesion securing and diffusion preventing layer is a single layer film of either the Cr film or Ti film, and the conductive layer is a Pt film or Au film.

5. The semiconductor pressure sensor device according to claim 1, wherein an antireflection film is interposed between the metal wiring layer and the adhesion securing and diffusion preventing layer.

6. The semiconductor pressure sensor device according to claim 5, wherein the antireflection film is a TiN film.

7. The semiconductor pressure sensor device according to claim 2, wherein the glass substrate is fixed to the rear surface of the semiconductor substrate by electrostatic bonding.

8. A method of manufacturing a semiconductor pressure sensor device disposed in an exhaust system of an internal combustion engine, wherein the semiconductor pressure sensor device comprises:
   a diaphragm, disposed on a semiconductor substrate, which is strained in accordance with a pressure;
   strain gauges connected to and disposed on the diaphragm;
   a metal wiring layer connected to the strain gauges and disposed on the semiconductor substrate via an interlayer insulating film;
   a passivation film having an opening portion from which the metal wiring layer is exposed;
   an adhesion securing and diffusion preventing layer, disposed on the passivation film, which coats the exposed top, and the edge portion, of the metal wiring layer; and
   a conductive layer configuring a pad electrode stacked on the adhesion securing and diffusion preventing layer,
   wherein the edge face of a stacked metal layer configured of the adhesion securing and diffusion preventing layer and conductive layer is of a normal tapered shape or stepped shape which expands toward the semiconductor substrate side, wherein the method comprises:
   a step of forming the passivation film having the opening portion; and
   a stacked metal layer formation step which forms the adhesion securing and diffusion preventing layer and conductive layer on the antireflection film and passivation film, wherein
   the stacked metal layer formation step includes: a step of forming the adhesion securing and diffusion preventing layer and conductive layer on the whole front surface side of the semiconductor substrate by sputtering; a step of selectively forming a resist mask on the formed conductive layer; and a step of etching the conductive layer and adhesion securing and diffusion preventing layer by ion milling.

9. The method of manufacturing the semiconductor pressure sensor device according to claim 8, wherein
   the normal tapered shape of the edge face of the stacked metal layer is formed by ion milling which etches the stacked metal layer by causing Ar ions to collide against the stacked metal layer via the mask.

10. The method of manufacturing the semiconductor pressure sensor device according to claim 9, wherein the front surface of the stacked metal layer is inclined downward so as to form an acute angle with reference to a direction perpendicular to the range axis of the Ar ions.

11. The method of manufacturing the semiconductor pressure sensor device according to claim 10, wherein an angle $\theta$ at which, with the range axis of the Ar ions being horizontalized, the front surface of the stacked metal layer is inclined downward with reference to a direction perpendicular to the horizontalized range axis is $0° \leq \theta \leq 50°$.

12. The method of manufacturing the semiconductor pressure sensor device according to claim 10, wherein the angle $\theta$ is $10° \leq \theta \leq 50°$.

13. A method of manufacturing a semiconductor pressure sensor device disposed in an exhaust system of an internal combustion engine, wherein the semiconductor pressure sensor device comprises:
   a diaphragm, disposed on a semiconductor substrate, which is strained in accordance with a pressure;
   a glass substrate fixed to the rear surface of the semiconductor substrate;
   strain gauges connected to and disposed on the diaphragm;

a metal wiring layer connected to the strain gauges and disposed on the semiconductor substrate via an interlayer insulating film;

a passivation film having an opening portion from which the metal wiring layer is exposed;

an adhesion securing and diffusion preventing layer, disposed on the passivation film, which coats the exposed top, and the edge portion, of the metal wiring layer; and a conductive layer configuring a pad electrode stacked on the adhesion securing and diffusion preventing layer, wherein the edge face of a stacked metal layer configured of the adhesion securing and diffusion preventing layer and conductive layer is of a normal tapered shape or stepped shape which expands toward the semiconductor substrate side, wherein the method comprises:

a step of forming the passivation film having the opening portion;

a step of fixing the glass substrate to the rear surface of the semiconductor substrate; and a stacked metal layer formation step which forms the adhesion securing and diffusion preventing layer and conductive layer on the antireflection film and passivation film, wherein the stacked metal layer formation step includes: a step of forming the adhesion securing and diffusion preventing layer and conductive layer on the whole front surface side of the semiconductor substrate by sputtering; a step of selectively forming a resist mask on the formed conductive layer; and a step of etching the conductive layer and adhesion securing and diffusion preventing layer by ion milling.

14. The method of manufacturing the semiconductor pressure sensor device according to claim 13, wherein the glass substrate is fixed to the rear surface of the semiconductor substrate by electrostatic bonding.

15. The method of manufacturing the semiconductor pressure sensor device according to claim 13, wherein the device further comprises an antireflection film interposed between the metal wiring layer and the adhesion securing and diffusion preventing layer and wherein the method further comprises forming the antireflection film on the metal wiring layer.

16. A method of manufacturing a semiconductor pressure sensor device disposed in an exhaust system of an internal combustion engine, wherein the semiconductor pressure sensor device comprises:

a diaphragm, disposed on a semiconductor substrate, which is strained in accordance with a pressure;

strain gauges connected to and disposed on the diaphragm;

a metal wiring layer connected to the strain gauges and disposed on the semiconductor substrate via an interlayer insulating film;

a passivation film having an opening portion from which the metal wiring layer is exposed;

an adhesion securing and diffusion preventing layer, disposed on the passivation film, which coats the exposed top, and the edge portion, of the metal wiring layer;

an antireflection film is interposed between the metal wiring layer and the adhesion securing and diffusion preventing layer; and a conductive layer configuring a pad electrode stacked on the adhesion securing and diffusion preventing layer, wherein the edge face of a stacked metal layer configured of the adhesion securing and diffusion preventing layer and conductive layer is of a normal tapered shape or stepped shape which expands toward the semiconductor substrate side, wherein the method comprises:

a step of forming the passivation film having the opening portion;

a step of forming the antireflection film on the metal wiring layer; and a stacked metal layer formation step which forms the adhesion securing and diffusion preventing layer and conductive layer on the antireflection film and passivation film, wherein the stacked metal layer formation step includes: a step of forming the adhesion securing and diffusion preventing layer and conductive layer on the whole front surface side of the semiconductor substrate by sputtering; a step of selectively forming a resist mask on the formed conductive layer; and a step of etching the conductive layer and adhesion securing and diffusion preventing layer by ion milling.

* * * * *